US010601330B1

(12) United States Patent
Cappabianca et al.

(10) Patent No.: US 10,601,330 B1
(45) Date of Patent: Mar. 24, 2020

(54) TERTIARY WINDING FOR COUPLED INDUCTOR STRUCTURES

(71) Applicant: Apple Inc., Cupertino, CA (US)

(72) Inventors: David P. Cappabianca, Gilroy, CA (US); Joseph T. DiBene, II, Corralitos, CA (US); Shawn Searles, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/697,283

(22) Filed: Sep. 6, 2017

(51) Int. Cl.
*H02M 3/158* (2006.01)
*H02M 3/335* (2006.01)
*H02M 1/12* (2006.01)
*H02M 1/08* (2006.01)
*H01L 27/02* (2006.01)
*H02M 1/00* (2006.01)

(52) U.S. Cl.
CPC .... *H02M 3/33576* (2013.01); *H01L 27/0288* (2013.01); *H02M 1/083* (2013.01); *H02M 1/12* (2013.01); *H02M 3/158* (2013.01); *H02M 2001/009* (2013.01)

(58) Field of Classification Search
CPC .... H02M 3/156; H02M 3/158; H02M 3/1588; H02M 3/155; H02M 3/1582; H02M 3/157; H02M 3/1563; H02M 2001/009; H02M 3/33576; H02M 1/083; H02M 1/12; H01L 27/0288
USPC ........... 323/280–285; 336/83, 170, 212–215, 336/221, 178, 184
See application file for complete search history.

(56) References Cited

U.S. PATENT DOCUMENTS

| 3,611,038 | A  |   | 10/1971 | Benham |            |
|-----------|----|---|---------|--------|------------|
| 6,084,354 | A  | * | 7/2000  | Kohmura | H01F 27/40 |
|           |    |   |         |        | 315/57     |
| 7,710,085 | B2 |   | 5/2010  | Park   |            |
| 8,924,170 | B2 |   | 12/2014 | Bengtsson |         |
| 2008/0080106 | A1 | * | 4/2008 | Mirafzal | H02M 1/12 |
|           |    |   |         |        | 361/42     |
| 2008/0164844 | A1 | * | 7/2008 | Kato | H01F 5/003 |
|           |    |   |         |        | 320/114    |
| 2010/0156194 | A1 | * | 6/2010 | Navid | H01F 17/04 |
|           |    |   |         |        | 307/105    |
| 2011/0169476 | A1 | * | 7/2011 | Ikriannikov | H01F 3/10 |
|           |    |   |         |        | 323/362    |
| 2013/0113598 | A1 | * | 5/2013 | Murillo | H01F 27/2885 |
|           |    |   |         |        | 336/84 C   |

(Continued)

*Primary Examiner* — Bryan R Perez
(74) *Attorney, Agent, or Firm* — Kowert, Hood, Munyon, Rankin & Goetzel, P.C.

(57) ABSTRACT

An embodiment of a system is disclosed, including an inductor, a voltage regulating circuit, a load, and a current detecting circuit. The inductor includes a first wire, a second wire, and a third wire. The third wire is between, and may be inductively coupled to, the first wire and the second wire. The voltage regulating circuit is coupled to a first end of the first wire and a first end of the second wire. The voltage regulating circuit is configured to generate a first current through the first wire and a second current through the second wire. The load is coupled to a second end of the first wire and a second end of the second wire. The current detecting circuit, coupled to ends of the third wire, is configured to generate an output signal based on a third current through the third wire.

20 Claims, 8 Drawing Sheets

(56) References Cited

U.S. PATENT DOCUMENTS

2013/0207563 A1\* 8/2013 Hamamoto ............. G05F 1/468
315/210

\* cited by examiner

TERTIARY WINDING FOR COUPLED INDUCTOR STRUCTURES

BACKGROUND

Technical Field

Embodiments described herein are related to the field of magnetic passive circuit components. More particularly, these embodiments relate to a structure for and method of creating inductively coupled devices.

Description of the Related Art

Magnetic devices, such as, for example, inductors, may be used in a variety of circuits. Inductors may be used to resist fluctuations of an electric current. The current stabilizing property of inductors makes them useful in power supply circuits and voltage regulating circuits, helping to reduce noise levels in power signals. Some voltage regulating circuits, such as, for example, an interleaved buck regulator, utilize two or more inductors to stabilize a multiphase output signal, with each inductor coupled to a respective phase output signal at a first terminal and to a common load on the other terminal. To generate a reduced noise power signal to the load, current through each inductor may be similar, creating a balance between the phase outputs. To create this balance between the phases, inductance values for each of the inductors may be similar. An imbalance between the phase output signals may result in a noisier power signal when compared to a balanced output.

SUMMARY OF THE EMBODIMENTS

Various embodiments of an inductive device are disclosed. Broadly speaking, a system is disclosed, including an inductor, a voltage regulating circuit, a load, and a current detecting circuit. The inductor may include a first wire, a second wire, and a third wire. The third wire may be between, and inductively coupled to, the first wire and the second wire. The voltage regulating circuit may be coupled to a first end of the first wire and a first end of the second wire, and configured to generate a first current through the first wire and a second current through the second wire. The load may be coupled to a second end of the first wire and a second end of the second wire. The current detecting circuit may be coupled to each end of the third wire, and configured to generate an output signal based on a third current through the third wire.

In a further embodiment, the third current may be based on a difference between the first current and the second current. In one embodiment, to generate the output signal, the current detecting circuit may be further configured to generate the output signal with a voltage level based on the third current.

In another embodiment, the voltage regulating circuit may be configured to adjust the first current in response to a determination that a voltage level of the output signal satisfies a first threshold level. In a further embodiment, the voltage regulating circuit may be configured to adjust the second current in response to a determination that a voltage level of the output signal satisfies a second threshold level.

In an embodiment, to adjust the first current, the voltage regulating circuit may be configured to adjust a frequency of a pulse-width modulation signal. In another embodiment, to adjust the first current, the voltage regulating circuit may be configured to adjust a pulse width of a pulse-width modulation signal. In one embodiment, the current detecting circuit may include a resistor circuit and an operational amplifier.

BRIEF DESCRIPTION OF THE DRAWINGS

The following detailed description makes reference to the accompanying drawings, which are now briefly described.

FIG. 1A shows a three dimensional view of the inductor. FIG. 1B illustrates a cross sectional view of the inductor.

Figure 1:
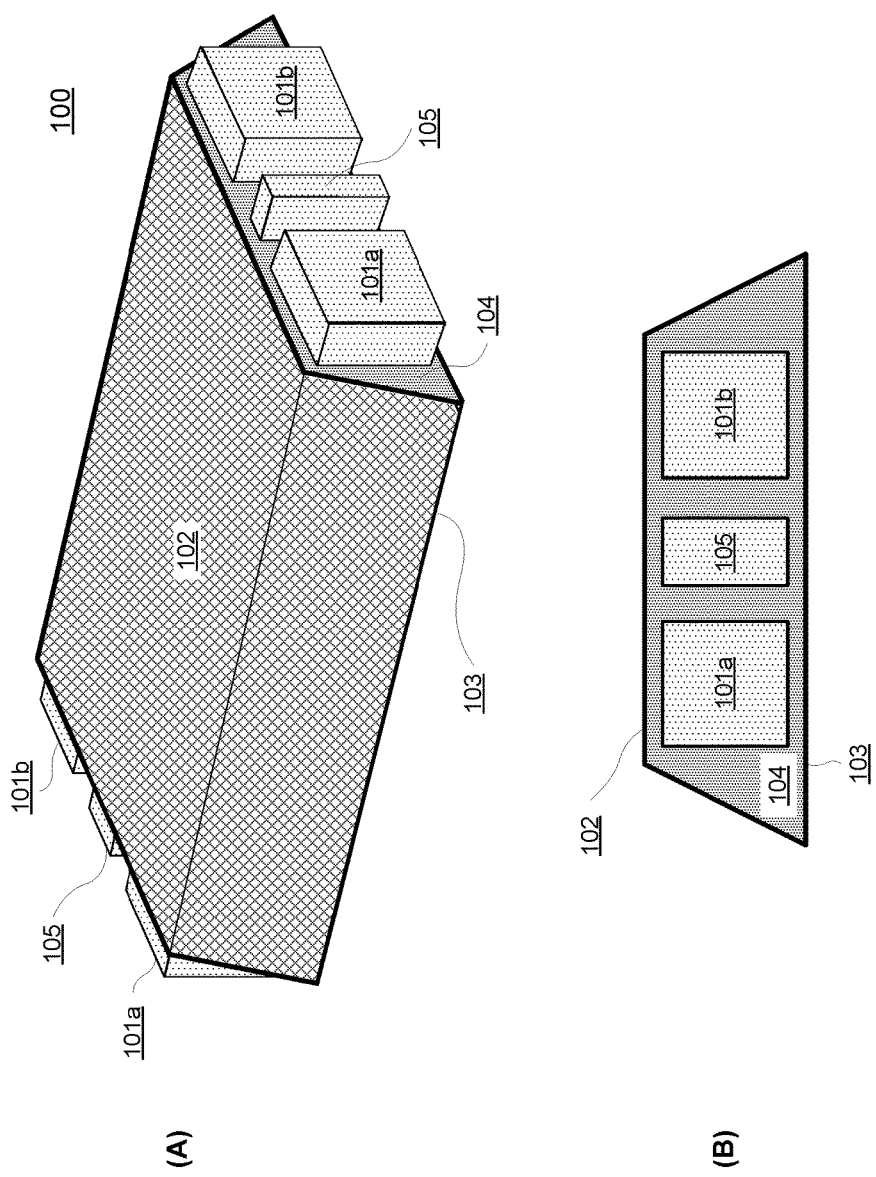
FIG. 1 includes two illustrations of an embodiment of an inductor.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION

Inductors can improve the performance of some power supply, voltage regulation, and current regulation designs.

For small, portable electronic devices, having an inductor design that is small and cost efficient may provide an advantage. In some embodiments, such as systems utilizing an interleaved buck regulator to generate a power signal, it may be advantageous to include one or more inductive circuit elements included in a same package. Co-packaging inductors may allow inductive coupling between the inductors, which may be useful for generating a power signal with reduced noise levels.

Many terms commonly used in reference to SoC designs are used in this disclosure. For the sake of clarity, the intended definitions of some of these terms, unless stated otherwise, are as follows.

It is noted that an "inductor" refers to an electronic component that resists changes in a current flowing through it. As current flows through an inductor, some energy resulting from the flow of current is temporarily stored in a magnetic field. When current passing through the inductor changes, the resulting change in the magnetic field induces a voltage in the inductor, which opposes the change in current. The amount of the opposition to current changes imparted by the magnetic field is characterized by a ratio of the voltage to the rate of change of the current, which is commonly referred to as inductance. Inductors may be employed in a variety of circuit applications and may be constructed using various manufacturing methods in order to achieve a desired inductance value.

A Metal-Oxide Semiconductor Field-Effect Transistor (MOSFET) describes a type of transistor that may be used in modern digital logic designs. MOSFETs are designed as one of two basic types, n-channel and p-channel. N-channel MOSFETs open a conductive path between the source and drain when a positive voltage greater than the transistor's threshold voltage is applied between the gate and the source. P-channel MOSFETs open a conductive path when a voltage greater than the transistor's threshold voltage is applied between the source and the gate.

Complementary MOSFET (CMOS) circuits or logic describes circuits designed with a mix of n-channel and p-channel MOSFETs. In CMOS designs, n-channel and p-channel MOSFETs may be arranged such that a high level on the gate of a MOSFET turns an n-channel transistor on, i.e., opens a conductive path, and turns a p-channel MOSFET off, i.e., closes a conductive path. Conversely, a low level on the gate of a MOSFET turns a p-channel on and an n-channel off. In addition, the term transconductance is used in parts of the disclosure. While CMOS logic is used in the examples, it is noted that any suitable digital logic process may be used for the circuits described in this disclosure.

It is noted that "high," "high level," and "high logic level" refer to a voltage sufficiently large to turn on a n-channel MOSFET and turn off a p-channel MOSFET while "low," "low level," and "low logic level" refer to a voltage that is sufficiently small enough to do the opposite. As used herein, a "logic signal" refers to a signal that transitions between a high logic level and a low logic level. In various other embodiments, different technology, including technologies other than CMOS, may result in different voltage levels for "low" and "high."

The embodiments illustrated and described herein may employ CMOS circuits. In various other embodiments, however, other suitable technologies may be employed.

Two views of an embodiment of an inductor are presented in FIG. 1. A three dimensional view of Inductor 100 is shown in FIG. 1a, while a cross-sectional view is shown in FIG. 1b. Inductor 100 includes Wires 101a, 101b, and 105 surrounded by Non-Conductive Material 104. A magnetized shell is created from Upper Magnetized Shell Segment 102 and Lower Magnetized Shell Segment 103. Each end of Wires 101a, 101b, and 105 extends past Non-Conductive Material 104 and Magnetized Shell Segments 102 and 103, and may be coupled to respective circuit nodes, thereby adding inductance to signals transmitted via the wires. In some embodiments, terminals may be coupled to each end of Wires 101a-b and 105, providing connection points from Inductor 100 to the respective circuit nodes.

Wires 101a-b and 105 may include of any suitable conductive material, such as, but not limited to, gold, copper, aluminum, and the like. Wires 101a-b are shown as being approximately equal in shape. In other embodiments, however, Wire 101b may have different shape than Wire 101a. Wire 105 is illustrated as smaller than each of Wires 101a-b. In other embodiments, however, Wire 105 may be a similar size or bigger. Each of Wires 101a-b and 105 are parallel to one another, and do not make electrical contact with each other.

It is noted that, as used herein, "parallel" is not intended to imply two perfectly equidistant objects. Instead, "parallel" is intended to describe two or more objects that are approximately uniform in distance from one another, within the limits of contemporary manufacturing capabilities. It is noted that one of ordinary skill in the art would understand that parallel wires, as used herein, refer to two or more wires that are substantially parallel to each other, but may run askew of one another by several degrees due to limitations of the manufacturing capabilities.

Non-Conductive Material 104 may include any suitable substance, such as, but not limited to, silicon dioxide (i.e., glass), rubber, plastic, or combination thereof. Non-Conductive Material 104 may be used to fill the space between each of Wires 101a-b and 105 and Magnetized Shell Segments 102 and 103 providing support for Wires 101a-b and 105, and conductively isolating Wires 101a-b and 105 from each other as well as from the Magnetized Shell Segments 102 and 103. Upper Magnetized Shell Segment 102 and Lower Magnetized Shell Segment 103 collectively form a magnetized shell along a length of Wires 101a-b and 105, increasing an amount of inductance associated with Wires 101a-b. Magnetized Shell Segments 102 and 103 may include of any suitable compound capable of being magnetized, including, but not limited to, materials made with iron, cobalt, or nickel.

The amount of inductance in each of Wires 101a-b and 105 may be determined based on several properties of Inductor 100. For example, the length of Magnetized Shell Segments 102 and 103, as well as the magnetic properties of Magnetized Shell Segments 102 and 103, may influence a magnetic field generated by current flowing in any of Wires 101a-b and 105. A surface area of each of Wires 101a-b and 105 that is exposed to the magnetic field may further influence the amount of inductance, as well as a distance between the outer surface of each of Wires 101a-b and 105, and the inner surface of Magnetized Shell Segments 102 and 103.

In the illustrated embodiment, Wires 101a-b and 105 are conductively isolated from each other, but are inductively coupled. A current running through Wire 101a, for example, may increase or decrease the inductance on Wires 101b and 105. If currents in each wire are in the same direction, then an amount of inductance may be increased on each wire. Conversely, if the currents are in opposite directions, then the amount of inductance may be decreased in each wire. In some embodiments, Wire 105 may be used to monitor currents flowing through Wires 101a and 101b. Since Wire 105 is situated between Wire 101a and Wire 101b, Wire 105 may have equal, or close to equal coupling to each of Wires 101a-b. Since Wire 105 is between each of Wires 101a-b, a current flowing in a given direction on Wire 101a may generate a current flowing in the opposite direction on Wire 105, while a current flowing in the same direction on Wire 101b may generate a current flowing in the same direction on Wire 105. Current flowing through both Wires 101a and 101b generate a current on Wire 105 that is equal to the difference in the amounts of current flowing in Wires 101a and 101b.

It is noted that Inductor 100 of FIG. 1 is merely an example for demonstration of disclosed concepts. The illustrated components are not necessarily shown to scale. The illustrated shapes, although shown with straight lines, may include curves and jagged edges consistent with a manufacturing process, such as a semiconductor fabrication process. Although two Wires 101 and one Wire 105 are shown, additional wires may be used, with an additional Wire 105 included between select pairs of Wires 101.

Figure 2:
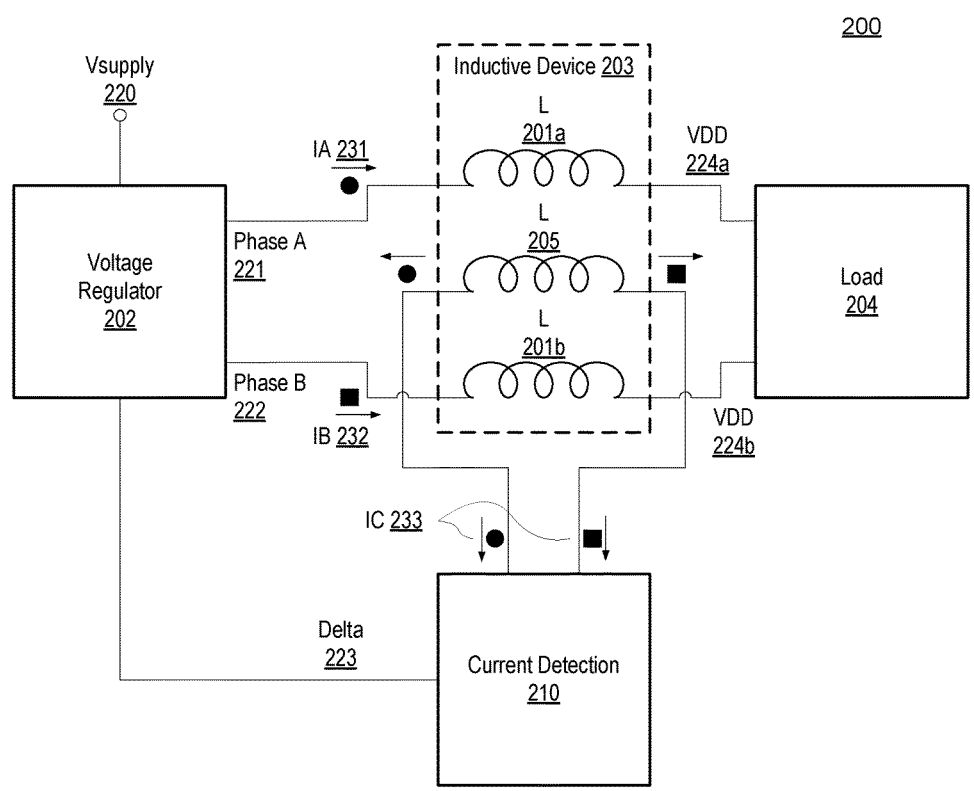
FIG. 2 shows a system for generating power signals to a load.

Moving to FIG. 2, a system for generating power signals to provide power to a load is shown. FIG. 2 illustrates a system for regulating a received power signal for use by a load. System 200 includes Voltage Regulator 202, Inductive Device 203, Load 204 and Current Detection Circuit 210. System 200 receives power signal Vsupply 220 and generates power signals VDD 224a and VDD 224b for use by Load 204.

Voltage Regulator 202 receives Vsupply 220 and generates a multiphase output power signal that includes Phase A 221 and Phase B 222. Voltage Regulator 202 may correspond to any suitable voltage regulating circuit including DC-to-DC regulating circuits as well as AC-to-DC regulating circuits. In the illustrated embodiment, Voltage Regulator 202 corresponds to a DC-to-DC multiphase buck regulation circuit that receives Vsupply 220 with a first voltage level and generates multiphase output signals Phase A 221 and Phase B 222 with a second, lower voltage level. To generate Phase A 221 and Phase B 222, Voltage Regulator 302 periodically couples each signal to Vsupply 220 using a respective transistor (or other type of switching device) that is enabled and disabled using a pulse width modulation (PWM) signal. Voltage Regulator 202 may generate the respective PWM signals such that Phase A 221 and Phase B 222 phase shifted from one another.

Phase A 221 and Phase B 222 are received by Inductive Device 203. Inductive Device 203 includes three inductive elements, or inductors, L 201a, L 201b and L 205 as shown in FIG. 2. Other embodiments, however, may include fewer or more inductors. In the illustrated embodiment, Inductive Device 203 corresponds to Inductor 100 in FIG. 1 with L 201a including Wire 101a, L 201b including Wire 101b, and L 205 including Wire 105. L 201a is coupled to Phase A 221 and L 201b is coupled to Phase B 222. Phase A 221 and Phase B 222 may each include a significant amount of noise if not coupled to L 201a and L 201b as they are repeatedly coupled and de-coupled from Vsupply 220. Since inductors resist sudden changes to current flow, L 201a and L 201b are, therefore, used to store energy when Phase A 221 and Phase B 222 are coupled to Vsupply 220 and release stored energy when Phase A 221 and Phase B 222 are de-coupled from Vsupply 220, thereby reducing noise levels on the phase outputs and providing a more consistent voltage level on power signals VDD 224a and VDD 224b provided to Load 204. If L 201a and L 201b have a same amount of inductance and Voltage Regulator 202 uses a same frequency and duty cycle on the respective PWM signals, then current through L 201a, IA 231 and current through L 201b, IB 232, may be equal if Load 204 draws a same amount of current from each of VDD 224a and VDD 224b.

If, however, Load 204 draws more current from either VDD 224a or VDD 224b, then IA 231 and IB 232 may not be equal. Current Detection Circuit 210 may be used to detect differences between IA 231 and IB 232. In the illustrated embodiment, Current Detection Circuit 210 is coupled to both ends of L 205. L 205 includes Wire 105 in Inductor 100 and, therefore, is inductively coupled to both L 201a and L 201b. IA 231 induces a current through L 205, IC 233, relative to the magnitude of IA 231. The direction of the current induced by IA 231 is in the direction of the circles. Similarly, IB 232 induces current IC 233, except IB 232 induces current in the direction of the squares. The magnitude of IC 233, therefore, is the difference between IA 231 and IB 232. When IA 231 and IB 232 are equal, then IC 233 is zero amperes (amps). When IA 231 is greater than IB 232, the IC 233 flows in the direction of the circles, and, conversely, when IB 232 is greater than IA 231, IC 233 flows in the direction of the squares. As used herein, "zero amps" refers to an amount of current that is substantially close to zero amperes. In various embodiments, IC 233 may include a non-zero amount of current flowing through L 205 that is, for example, less than an amount that is of concern for a particular embodiment, or less than an amount that may be reliably detected by Current Detection Circuit 210.

Current Detection Circuit 210 generates a signal, Delta 223, to indicate the magnitude and direction of IC 233. For example, Delta 223 may have a voltage level that is between a ground reference and a level of a power signal. The closer the level of Delta 223 is to the ground reference, then the higher IA 231 is than IB 232. The closer the level of Delta 223 is to the level of the power signal, then the higher IB 232 is than IA 231. A voltage level of Delta 223 that is midway between the ground reference and the power signal, may indicate that IA 231 and IB 232 have similar amounts of current. Voltage Regulator 202 may use the voltage level of Delta 223 to adjust the PWM control signals for generating Phase A 221 and/or Phase B 222. Additional details regarding operation of a voltage regulating system are presented below.

It is noted that System 200 of FIG. 2 is one example for demonstration purposes. Some operational details have been omitted to focus on the disclosed subject matter. Other embodiments may include additional circuit blocks.

Figure 3:
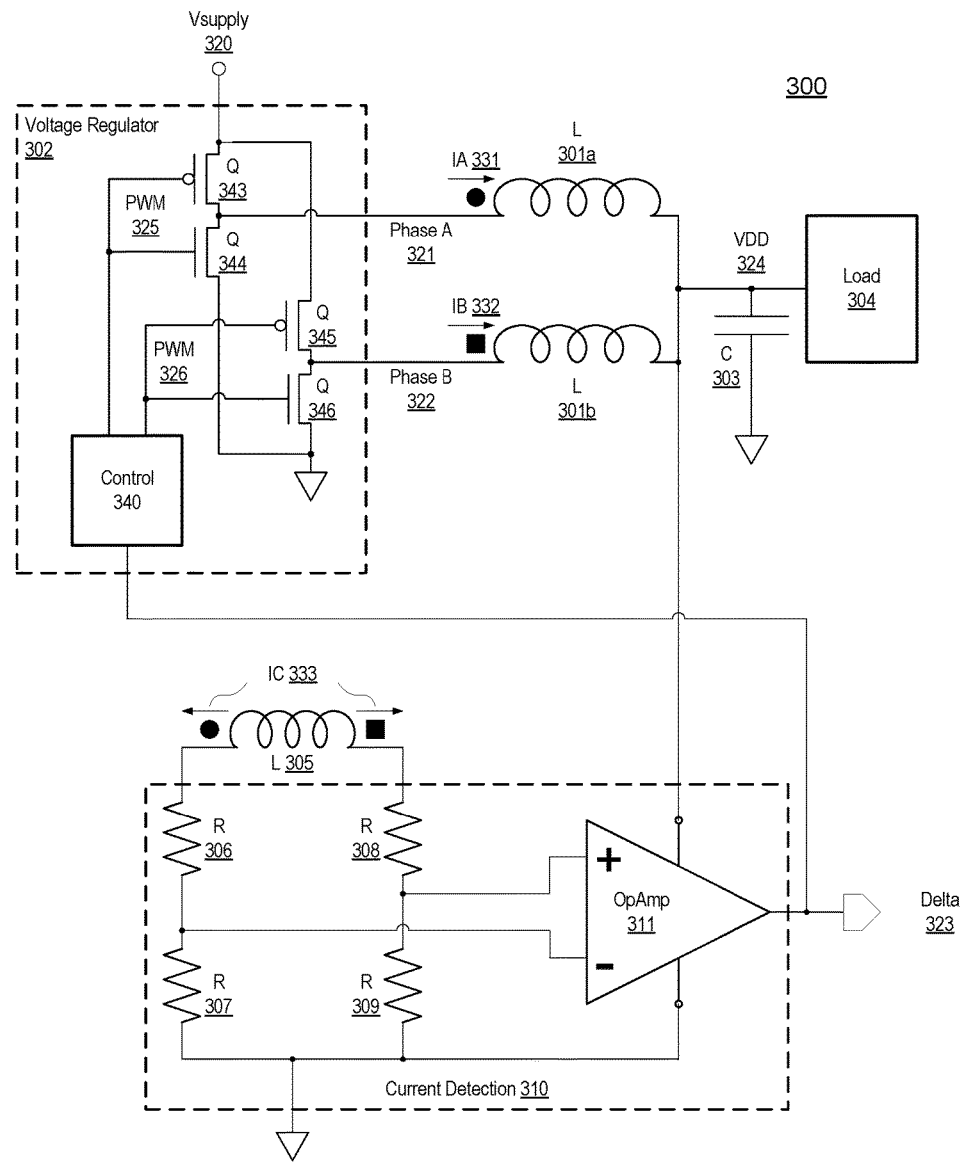
FIG. 3 depicts another system for generating power signals to a load.

Turning to FIG. 3, another system for generating power signals to provide power to a load is depicted. System 300 may, in some embodiments, correspond to system 200 in FIG. 2. System 300 includes Voltage Regulator 302, which contains Control Circuit 340 and switching devices Q 343, Q 344, Q 345, and Q 346. Voltage Regulator 302 is coupled to inductors L 301a and L 301b, which, in turn, are each coupled to capacitor C 303 and Load 304. System 300 further includes Current Detection Circuit 310, which contains operational amplifier (OpAmp) 311 and resistors R 306, R 307, R 308, and R 309. R 306 and R 308 are coupled to inductor L 305.

Voltage Regulator 302 receives Vsupply 320 and generates output signals Phase A 321 and Phase B 322. To generate the output signals, Control Circuit 340 generates two pulse width modulated signals, PWM 325 and PWM 326. PWM 325 is coupled to a gate terminal of Q 344 and to a gate terminal of Q 343. PWM 326 is likewise, coupled to a gate terminal of Q 346 and a gate terminal of Q 345. In the illustrated embodiment, Q 343, Q 344, Q 345, and Q 346 are shown as p-channel and n-channel MOSFETs. In other embodiments, however, any suitable type of transconductance switching device may be used. A duty cycle of PWM 325 may affect the voltage level of Phase A 321 by coupling Phase A 321 to Vsupply 320 for a portion of a time period via Q 343 and to a ground reference via Q 344 for a remaining portion of the time period. The longer the portion of the time period that Phase A 321 is coupled to Vsupply 320, the closer the voltage level of Phase A 321 will be to the voltage level of Vsupply 320. A duty cycle of PWM 326 similarly affects the voltage level of Phase B 322, using Q 345 and Q 346. It is noted that, in the illustrated embodiment, the lower that the duty cycles of the PWM signals are, the higher the voltage level of Phase A 321 and Phase B 322 will be, and vice versa.

In the illustrated embodiment, Phase A 321 and Phase B 322 are coupled to L 301a and L 301b, respectively. When Phase A 321 and Phase B 322 are coupled to Vsupply 320, current flows into each inductor. IA 331 corresponds to the current flowing through L 301a and IB 332 corresponds to the current flowing through L 301b. Since inductors resist changes to current, L 301a and L 301b help to make IA 331 and IB 332, respectively, more consistent while Q 343 through Q 346 are switched off and on. IA 331 and IB 332 are joined at Load 304 and provide charge to C 303. The combination of L 301a, L 301b and C 303 help to generate a power supply signal, VDD 324, with an acceptably low level of noise for Load 304. Control Circuit 340 may generate PWM 325 and PWM 326 out of phase with each other such that Q 343 is on for at least a portion of time that Q 345 is off, and vice versa. This out-of-phase generation of IA 331 and IB 332 may help to reduce noise on VDD 324 by providing power from V supply 320 to Load 304 for a longer portion of the time period.

In the illustrated embodiment, inductors L 301a, L 301b, and L 305 collectively correspond to Inductor 100 in FIG. 1. L 301a includes Wire 101a, L 301b includes Wire 101b, and L 305 includes Wire 105. L 305 is, therefore, inductively coupled to L 301a and L 301b. Similar to the description above for FIG. 2, the inductive coupling results in IA 331 generating a current in L 305 in the direction of the circle and in IB 332 generating a current in the direction of the square. IC 333, therefore, flows in the direction of the circle when IA 331 is greater than IB 332, and in the direction of the square when the opposite is true. When IA 331 and IB 332 are equal, then IC 333 is zero amperes. IC 333 flows through the resistor network of R 306 through R 309. When IC 333 flows towards the circle, then a positive voltage is generated at the negative terminal and a negative voltage at the positive terminal of OpAmp 311, resulting in OpAmp 311 generating the signal Delta 323 with a voltage level closer to the ground reference. When the opposite is true, and IC 333 flows towards the square, then the voltage level of the positive terminal is positive and the negative terminal is negative, and OpAmp 311 generates Delta 323 with a voltage level closer to VDD 324.

Control Circuit 340 receives Delta 323, and based on the voltage level of Delta 323, may adjust one or both of the PWM signals. Control Circuit 340 may compare the voltage level of Delta 323 to an upper and a lower threshold value to determine if an adjustment is appropriate. For example, the voltage level of Delta 323 being greater than the upper threshold value may indicate that IA 331 is lower than IB 332 by more than an acceptable amount. In response, Control Circuit 340 may increase the duty cycle of the PWM 325 to increase IA 331. In other cases, Control Circuit 340 may decrease the duty cycle of PWM 326 to reduce IB 332. Similarly, the level of Delta 323 being less than the lower threshold value may indicate that IB 332 is less than IA 331 by more than an acceptable amount. Control Circuit 340 may make opposite adjustments to PWM 326 and/or PWM 325 to increase the level of IB 332 or decrease the level of IA 331. Keeping the current levels of IA 331 and IB 332 close to one another may help to generate VDD 324 with less noise.

Control Circuit 340 may also perform a calibration process. Such a calibration process may be performed during a test procedure and/or periodically during operation of System 300. To perform the calibration procedure in the illustrated embodiment, Control Circuit 340 holds PWM 326 at a high logic level, thereby disabling Q 345, and generates PWM 325 with a particular duty cycle, thereby generating IA 331 with a greater than zero amp current while IB 332 is zero amps. OpAmp 311 generates Delta 323 with a voltage level that is indicative of IA 331, which is received by Control Circuit 340. Control Circuit 340 repeats this process with PWM 325 held high to disable Q 343 and generates PWM 326 with the particular duty cycle, thereby generating IB 332 with a greater than zero amp current while IA 331 is zero amps. Control Circuit 340 receives Delta 323 with a voltage level indicative of IB 332. If L 301a and L 301b are suitably matched (e.g., similar amounts of inductance), then the two received levels of Delta 323 will be similar. If however, the two received voltage levels differ by more than a threshold amount, then Control Circuit 340 may determine a compensation factor to use in the generation of PWM 325 and PWM 326 to compensate for the detected mismatch between L 301a and L 301b. For example, if the voltage level of Delta 323 is higher for IA 331 than it is for IB 332, then Control Circuit 340 may use a different initial duty cycle for PWM 326.

It is noted that System 300 in FIG. 3 is an examples for demonstration purposes. Some operational details have been omitted to focus on the disclosed subject matter. In other embodiments, additional components may be included. Although Voltage Regulator 302 is illustrated with two phase outputs, additional phase outputs may be used in other embodiments.

Figure 4:
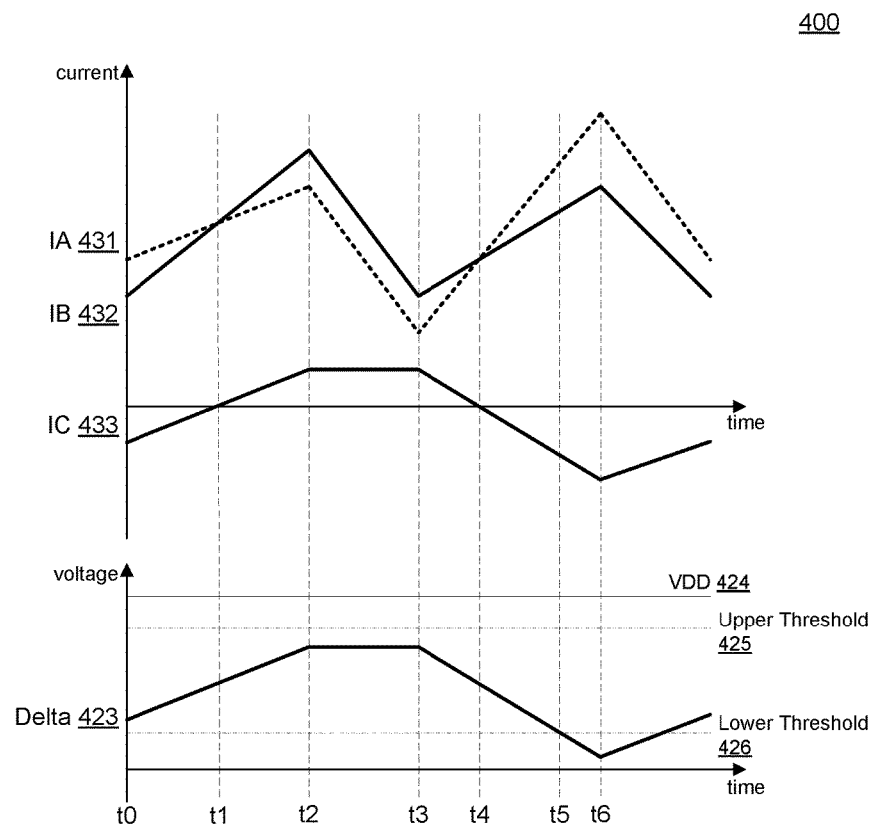
FIG. 4 illustrates a chart representing signals associated with an embodiment of a system for generating power signals to a load.

Proceeding to FIG. 4, a chart representing signals associated with an embodiment of a system for generating power signals to a load is illustrated. Chart 400 may correspond to signals generated during operation of System 200 in FIG. 2 or System 300 in FIG. 3. Referring to System 300 in FIG. 3, Chart 400 includes three signals showing current versus time during operation of System 300, and one signal showing voltage versus time. In the illustrated embodiment, IA 431 corresponds to IA 331, IB 432 corresponds to IB 332, IC 433 corresponds to IC 333, and Delta 423 corresponds to Delta 323. Two threshold voltages are indicated by horizontal dashed lines, Upper Threshold 425 and Lower Threshold 426.

At time t0, IB 432 flowing through L 301b is less than IA 431 flowing though L 301a. The difference between IB 432 and IA 431 induces a current through L 305, IC 433. In the illustrated embodiment, positive current corresponds to current flowing from L 305 to the square and negative current corresponds to current flowing from L 305 to the circle. In other embodiments, the polarity may be reversed. Since IB 432 is less than IA 431, IC 433 is negative. The negative IC 433 results in a positive voltage level being generated across R 307 and a negative voltage across R 309. OpAmp 311, therefore, generates Delta 423 with a voltage level that is closer to the ground reference than to VDD 424. The voltage level of Delta 423 is, however, above Lower Threshold 426. Control Circuit 340, therefore, may not alter control signals PWM 325 or PWM 326.

At time t1, IA 431 and IB 432 are equal. IC 433 is zero amps and the voltage level of Delta 423 is halfway between VDD 424 and ground. By time t2, IB 432 is greater than IA 431. In addition, the currents of both IA 431 and IB 432 transition to a negative slope. From time t2 to time t3, IB 432 remains greater than IA 431 with approximately the same different during this time period. IC 433, therefore, remains at a consistent positive current level during this time. Likewise, Delta 423 maintains a steady voltage level from time t2 to time t3. The voltage level of Delta 423 also remains below Upper threshold 425. Control Circuit 340 may, therefore, continue to generate PWM signals 321 and 322a with no changes based on Delta 423.

A time t3, both IA 431 and IB 432 begin to increase, and by time t4, IA 431 and IB 432 are equal again. IC 433 is zero amps. At time t5, IC 433 reaches a current level sufficient to cause the voltage level of Delta 423 to fall below Lower Threshold 426. In response, Control Circuit 340 may adjust PWM 325 and/or PWM 326 in order to reduce IA 431, and/or increase IB 432. At time t6, the changes by Control Circuit 340 may begin to take effect and IA 431 starts to fall faster than IB 432.

It is noted that Chart 400 illustrated in FIG. 4 is merely an example. The depicted waveforms are simplified for clarity and differences between the waveforms may be exaggerated for emphasis. In other embodiments, the waveforms may not be as linear as shown in FIG. 4, and some noise may be included due to other operations in System 300.

Figure 5A:
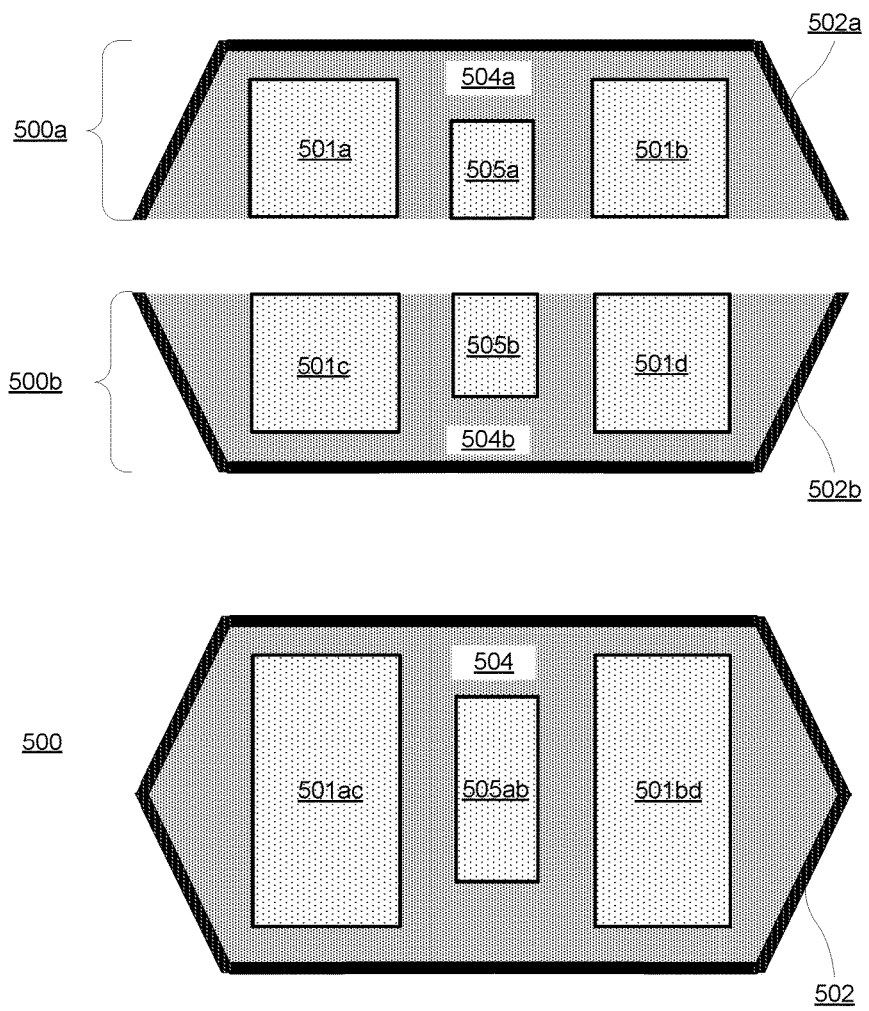
FIG. 5A shows an embodiment of an inductor created by combining two similar inductive structures.

Turning to FIG. 5A, an embodiment of an inductor created by combining two similar inductive structures is shown. In the illustrated embodiment, Inductor 500 is created by joining two inductive structures together. First Inductive Structure 500a includes Wires 501a-b and 505a, surrounded by Non-Conductive Material 504a and partially covered by Magnetized Shell Segment 502a. Second Inductive Structure 500b includes Wires 501c-d and 505b, surrounded by Non-Conductive Material 504b and partially covered by Magnetized Shell Segment 502b.

Inductor 500 is formed by combining Inductive Structures 500a and 500b by inverting Inductive Structure 500b and attaching it to the bottom of Inductive Structure 500a. Both Inductive Structures 500a and 500b may, in some embodiments, be created in a semiconductor fabrication process. Inductive Structure 500a may be attached to Inductive Structure 500b using any suitable adhesive, such as, for example, a non-conductive epoxy applied to Non-Conductive Material 504a and 504b, thereby forming Non-Conductive Material 504. In some embodiments, Wires 501a-d and 505a-b may be conductively isolated from one another, resulting in Inductor 500 being capable of passing separate signals through each wire. In the illustrated embodiments, Wires 501a, 501b, and 505a are conductively coupled to Wires 501c, 501d, and 505b, respectively, resulting in Inductor 500 having three wires, Wires 501ac, 501bd, and 505ab. Wires 501a and 501c, as well as Wires 501b and 501d, and Wires 505a and 505b, may be attached using any suitable method, such as, for example, metal bumps on the adjoining sides.

Figure 5B:
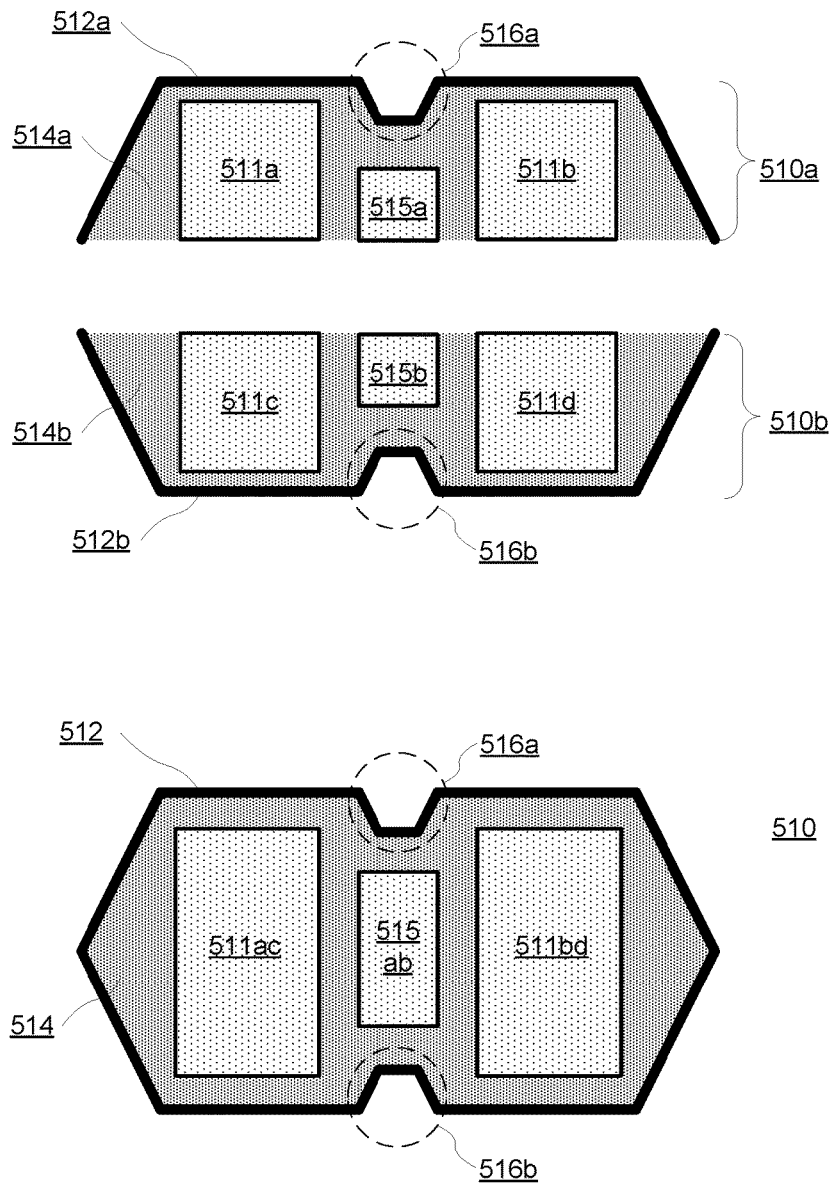
FIG. 5B shows another embodiment of an inductor created from two similar inductive structures.

Inductor 500 may, in some embodiments, correspond to Inductive Device 203 in FIG. 2 or to Inductors L 301a, L 301b, and L 305 in FIG. 5. Wire 505ab may be inductively coupled to both Wire 501ac and Wire 501bd. In addition, the smaller size of Wire 505ab as compared to Wires 501ac and 501bd, may allow Wires 501ac and 501bd to additionally be inductively coupled to each other. Magnetic Shell 502 may impart inductive properties onto each of the three wires. A variation of Inductor 500 is shown in FIG. 5B.

FIG. 5B illustrates another embodiment of an inductor created from two similar inductive structures. Similar to the embodiment of FIG. 5A, Inductor 510 is created by joining, as described above for Inductor 500, Inductive Structures 510a and 510b. Like Inductor 500, First Inductive Structure 510a includes Wires 511a-b and 515a, surrounded by Non-Conductive Material 514a and partially covered by Magnetized Shell Segment 512a, while Second Inductive Structure 510b includes Wires 511c-d and 515b, surrounded by Non-Conductive Material 514b and partially covered by Magnetized Shell Segment 512b. After Inductive Structures 510a and 510b are joined, the resulting Inductor 510 includes Wires 511ac, 511bd, and 515ab, all surrounded by Non-Conductive Material 514. Magnetized Shell 512 is formed from Magnetized Shell Segments 512a and 512b.

In addition to the elements that are similar to Inductor 500, First Inductive Structure 510a and Second Inductive Structure 510b include channels 516a and 516b, respectively. When Inductive Structures 510a and 510b are joined to create Inductor 510, Channels 516a and 516b may provide further capabilities for controlling parameters of Inductor 510, such as a saturation current level, as well as a level of inductance on Wires 511ac, 511bd, and 515ab. Although Channels 516a-b are shown as having similar shapes, including width and depth, each channel may be shaped independently to achieve desired properties. In some embodiments, either of Channels 516a-b may be omitted, leaving a single channel on one side of Inductor 510.

It is noted that FIGS. 5A and 5B are merely examples. Although three wires are shown in each of Inductive Structures 500a, 500b, 510a and 510b, any suitable number of wires may be used. The relative sizes and shapes of the wires and the magnetic shells may differ in other embodiments.

Figure 6:
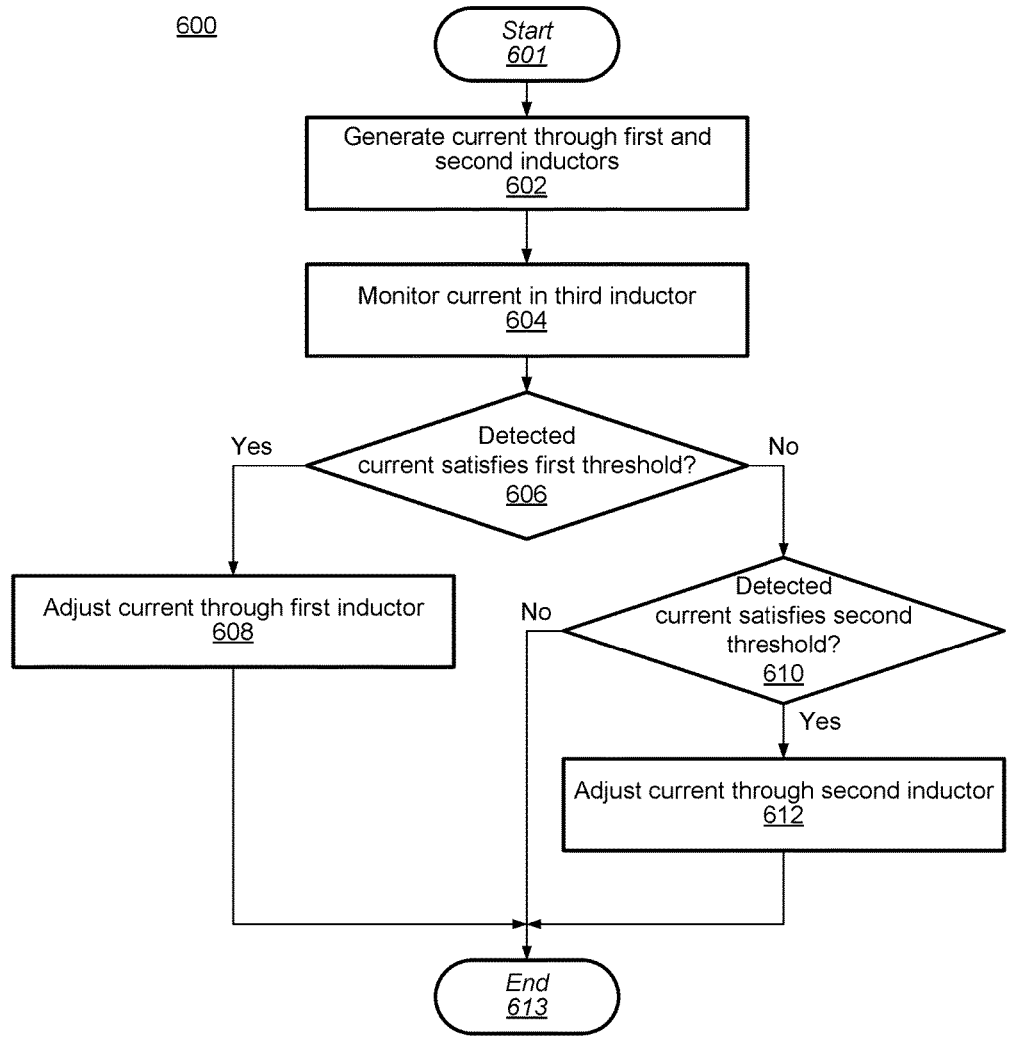
FIG. 6 depicts a flow diagram of an embodiment of a method for regulating a power signal.

Moving to FIG. 6, a flow diagram of an embodiment of a method for regulating a power signal is depicted. Method 600 may be applied to System 200 in FIG. 2 or System 300 in FIG. 3. Referring collectively to FIG. 3 and the flow diagram of FIG. 6, Method 600 begins in block 601.

Current is generated through a first and a second inductor (block 602). In the illustrated embodiment, Voltage Regulator 302 uses signals PWM 325 and PWM 326 to couple L 301a and L 301b to Vsupply 320 for a portion of a time period. Currents IA 331 and IB 332 are generated based on the portion of the time period that L 301a and L 301b are coupled to Vsupply 320, the longer the portion of the time period, the higher the currents IA 331 and IB 332 may be.

Current flowing through a third inductor is monitored (block 604). Current Detection Circuit 310, in the depicted embodiment, monitors IC 333 flowing through L 305. L 305 is inductively coupled to L 310a and L 301b. The amount of current IC 333 is based on a difference between the amount of current IA 331 and the amount of current IB 332. IC 333 generates a voltage across R 307 and R 309 that is based on the amount and direction of IC 333. When IB 332 is greater than IA 331, IC 333 is positive and the voltage generated across R 309 is greater than the voltage generated across R 307. In response, OpAmp 311 generates an output signal, Delta 323, with a voltage level that is closer to VDD 324 than to the ground reference. When the opposite is true, IC 333 is negative and the voltage generated across R 307 is greater than the voltage generated across R 309. OpAmp 311, as a result, generates Delta 323 with a voltage level closer to the ground reference than to VDD 324. When IA 331 and IB 332 are equal, then IC 333 nears zero amps, and the voltages across R 307 and R 309 are equal. OpAmp 311 generates Delta 323 with a voltage level that is approximately half of the level of VDD 324.

Further operations of Method 600 may depend on a comparison of the monitored current to a first threshold (block 606). In the illustrated embodiment, Control Circuit 340 in Voltage Regulator 302 receives Delta 323 and compares the voltage level to a first threshold value, such as, for example, Upper Threshold 425, or Lower Threshold 426 in FIG. 4. For the illustrated embodiment, Delta 323 is compared to Upper Threshold 425. A value of Upper Threshold 425 may be selected to correspond to IA 331 being less than IB 332 by a threshold amount. If the voltage level of Delta 323 satisfies the first threshold value (e.g., the voltage level of Delta 323 is greater than Upper Threshold 425), then the method moves to block 608 to adjust the PWM control signals. Otherwise, the Method moves to block 610 to compare Delta 323 to a second threshold value.

An amount of current flowing through the first inductor is adjusted (block 608). Control Circuit 340, in the depicted embodiment, adjusts PWM 325 to increase IA 331. The adjustment may include increasing the duty cycle of PWM 325. In other embodiments, the adjustment may include other changes, such as, for example, adjusting a frequency of pulses generated on PWM 325. In some embodiments, PWM 326 may be adjusted to reduce IB 332 in addition to, or instead of adjusting PWM 325. The method then ends in block 613.

If, in block 606, the voltage level of Delta 323 does not satisfy the first threshold value, then subsequent operations of the method may depend on a comparison of the monitored current to a second threshold (block 610). If, in the illustrated embodiment, the level of Delta 323 is below Upper Threshold 425, then Control Circuit 340 may compare the Delta 323 to a second threshold value, such as, e.g., Lower Threshold 426 in FIG. 4. The Lower Threshold 426 may be selected to indicate if IB 332 is less than IA 331 by a threshold amount. If the second threshold is satisfied (e.g., the level of Delta 323 is less than Lower Threshold 426), then the method moves to block 612 to adjust the PWM control signals. Otherwise, the method ends in block 613.

An amount of current flowing through the second inductor is adjusted (block 612). Control Circuit 340, in the depicted embodiment, adjusts PWM 326 to increase IB 332. The adjustment may include increasing the duty cycle of PWM 326, and/or adjusting a frequency of pulses generated on PWM 326. In some embodiments, PWM 325 may be adjusted to reduce IA 331 in addition to, or instead of adjusting PWM 326. The method then ends in block 613.

It is noted that Method 600 in FIG. 6 is merely an example. The operations have been simplified for clarity. In other embodiments, more or fewer operations may be included. In some embodiments, two or more operations may be performed in parallel, such as, for example, operations in blocks 606 and 610.

Figure 7:
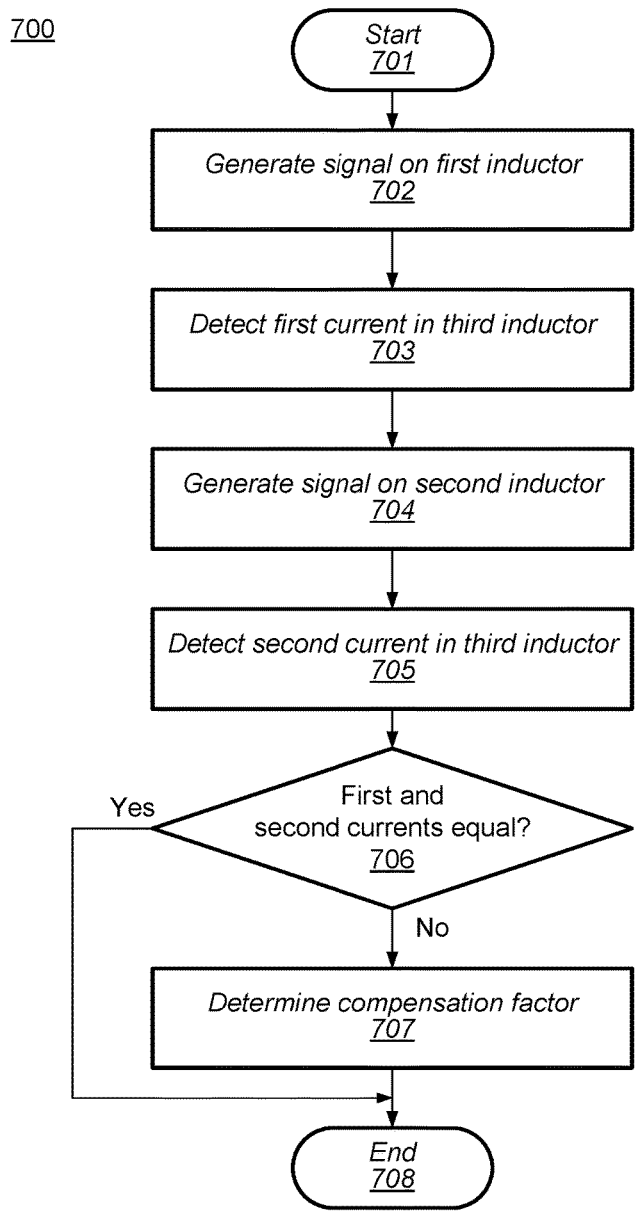
FIG. 7 illustrates a flow diagram of an embodiment of a method for balancing a voltage regulation system.

Proceeding to FIG. 7, a flow diagram of an embodiment of a method for balancing a voltage regulation system is illustrated. Method 700, similar to Method 600 in FIG. 6, may be applied to System 200 in FIG. 2 or System 300 in FIG. 3. Referring collectively to FIG. 3 and the flow diagram of FIG. 7, Method 700 begins in block 701.

Current is generated through a first inductor (block 702). In the illustrated embodiment, Control Circuit 340 in Voltage Regulator 302 generates PWM 325 to couple L 301a to Vsupply 320 for a portion of a time period. Currents IA 331 is generated based on the portion of the time period that L 301a is coupled to Vsupply 320, the longer the portion of the time period, the higher current IA 331 may be. Control Circuit 340 also generates PWM 326 with a high signal, which causes Phase B 322 to be low, which may result in a negative current through a second inductor, L 301b. In addition, Load 304 may be disabled or put into a reduced power state to reduce current flowing into Load 304.

Current flowing through a third inductor is monitored (block 703). Current Detection Circuit 310, in the depicted embodiment, monitors IC 333 flowing through L 305. As previously disclosed, L 305 is inductively coupled to L 310a and L 301b and IC 333 is based on a difference between IA 331 and IB 332. With control signals PWM 325 and PWM 326 generated as described in block 702, IA 331 is greater than IB 332. IC 333 is, therefore negative and the voltage generated across R 307 is greater than the voltage generated across R 309. OpAmp 311, as a result, generates Delta 323 with a voltage level closer to the ground reference than to VDD 324. This first level of Delta 323 may be received in Control Circuit 340 and converted into a value representing IA 331.

Current is generated through the second inductor (block 704). Control Circuit 340, in the illustrated embodiment, reverses the PWM signals. PWM 326 is generated to couple L 301a to Vsupply 320 for a portion of a time period, and, therefore, generate IB 332. Control Circuit 340 also generates a high logic value on PWM 325, thereby pulling Phase A 321 to the ground reference. Load 304 may remain in the disabled or reduced power state.

Current flowing through the third inductor is monitored (block 705). In the depicted embodiment, Current Detection Circuit 310 monitors IC 333 flowing through L 305. With control signals PWM 325 and PWM 326 generated as described in block 704, IB 332 is greater than IA 331. IC 333 is, therefore positive and the voltage generated across R 309 is greater than the voltage generated across R 307. OpAmp 311, as a result, generates Delta 323 with a voltage level closer to VDD 324 than to the ground reference. This second level of Delta 323 may be received in Control Circuit 340 and converted into a value representing IB 332.

Subsequent operations of Method 700 may depend on the values representing IA 331 and IB 332 (block 706). Control Circuit 340 compares the values representing the measurements of IA 331 and IB 332. If the two values are same, then inductors L 301a and L 301b are balanced and no compensation factor may be used during normal operation of System 300, when power is being provided to Load 304. The method, in this case, ends in block 708. Otherwise, Method 700 moves to block 707 to determine a compensation factor based on a difference between the two values.

The compensation factor is determined (block 707). Control Circuit 340, in the illustrated embodiment, determines a difference between the current values representing IA 331 and IB 332. Based on this determined difference, Control Circuit 340 determines one or more calibration values to be used when Voltage Regulator 302 is providing a power signal to Load 304. The compensation value, or values, may be used in a number of ways compensate for a mismatch between L 301a and L 301b. The mismatch may be a result of a manufacturing defect, differences between circuit connections, variations in circuit components, and the like. The compensation value may, be used to adjust Current Detection Circuit 310 by, for example, modifying one or more resistance values for resistors R 306-309, or adjusting a trim value of OpAmp 311. In other embodiments, the compensation value may be used to adjust one or more threshold values, such as, e.g., Upper Threshold 425 or Lower Threshold 426. In some embodiments, the compensation value may be used to modify an initial duty cycle value for PWM 325 and/or PWM 326. Any suitable use of the compensation value may be utilized. The method ends in block 708.

It is noted that Method 700 in FIG. 7 is an example method for determining a compensation value for a voltage regulating system. In other embodiments, more or fewer operations may be included. In some embodiments, operations may be performed in a different order.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A system, comprising:
    an inductor, including a first wire, a second wire, and a third wire, wherein the third wire is between, and inductively coupled to, the first wire and the second wire;
    a voltage regulating circuit, coupled to a first end of the first wire and a first end of the second wire, and configured to generate a first current through the first wire corresponding to a first power signal, and a second current through the second wire corresponding to a second power signal, different from the first power signal;
    a load coupled to a second end of the first wire and a second end of the second wire; and
    a current detecting circuit, coupled to ends of the third wire, and configured to generate an output signal based on a magnitude of a third current through the third wire, wherein the third current is generated by the inductive coupling to the first and second wires and is based on a difference between a magnitude of the first current and a magnitude of the second current;
    wherein the voltage regulating circuit is further configured to adjust the magnitude of the first current in response to a determination that a voltage level of the output signal satisfies a first threshold level.

2. The system of claim 1, wherein the inductor includes a non-conductive material covering and preventing conductive contact between the first wire, second wire, and third wire within the inductor.

3. The system of claim 2, wherein the inductor includes a shell, including an upper portion and a lower portion, surrounding a portion of the non-conductive material, wherein the shell includes at least one magnetized layer.

4. The system of claim 1, wherein to generate the output signal, the current detecting circuit is further configured to generate the output signal with a voltage level based on the magnitude of the third current.

5. The system of claim 1, wherein the first threshold level is indicative of the second current being higher than the first current, and wherein to adjust the magnitude of the first current, the voltage regulating circuit is configured to the magnitude of the first current in response to a determination that a voltage level of the output signal satisfies a first threshold level.

6. The system of claim 1, the voltage regulating circuit is further configured to adjust the magnitude of the second current in response to a determination that a voltage level of the output signal satisfies a second threshold level.

7. A method, comprising:
    generating, by a voltage regulating circuit, a first current corresponding to a first phase of a power signal through a first inductor that includes a first wire and a magnetic shell, and a second current corresponding to a second phase of the power signal through a second inductor that includes a second wire and the magnetic shell;
    monitoring, by a current detection circuit, a magnitude of a third current through a third inductor that includes the magnetic shell and a third wire inductively coupled to the first wire and the second wire, wherein the third current is induced by an inductive coupling to the first and second wires and is based on a difference between a magnitude of the first current and a magnitude of the second current;
    at a first time, adjusting the magnitude of the first current, in response to determining that the magnitude of the third current satisfies a first threshold, by adjusting a duty cycle of a first pulse width modulation signal while maintaining a duty cycle of a second pulse width modulation signal;
    and at a second time, adjusting the magnitude of the second current, while maintaining the magnitude of the first current, in response to determining that the third current satisfies a second threshold.

8. The method of claim 7, wherein adjusting the magnitude of the second current while maintaining the magnitude of the first current includes adjusting the duty cycle of the second pulse width modulation signal while maintaining the duty cycle of the first pulse width modulation signal.

9. The method of claim 7, wherein the third current flows in a particular direction through the third wire when the magnitude of the first current is greater than the magnitude of the second current and flows in an opposite direction through the third wire when the magnitude of the first current is less than the magnitude of the second current.

10. The method of claim 7, further comprising, at a third time:
    generating a particular signal on the first inductor while coupling the second inductor to a ground node;
    detecting the magnitude of the third current through the third inductor while generating the particular signal on the first inductor; and
    determining a first value based on the magnitude of the third current.

11. The method of claim 10, further comprising, at a fourth time:
    generating the particular signal on the second inductor while coupling the first inductor to a ground node;
    detecting the magnitude of the third current through the third inductor while generating the particular signal on the second inductor; and
    determining a second value based on the magnitude of the third current.

12. The method of claim 11, further comprising determining a compensation value based on a difference between the first value and the second value in response to determining that the first and second values are not equal.

13. The method of claim 7, further comprising generating an output signal with a voltage level based on the magnitude of the third current.

14. An inductive device, comprising:
a first wire;
a second wire, parallel to the first wire;
a third wire, inductively coupled to the first wire and the second wire, wherein a crosssectional area of the third wire is less than a cross-sectional area of the first wire, and less than a cross-sectional area of the second wire;
a non-conductive material covering the first wire, second wire, and third wire; and
a shell, including an upper portion and a lower portion, surrounding a portion of the non-conductive material, wherein the shell includes at least one magnetized layer;
wherein the shell, and the first, second, and third wires are created by joining two similar inductive structures together, each of two similar inductive structures including a respective portion of the first, second, and third wires; and
wherein a difference between a magnitude of a first current through the first wire and a magnitude of a second current through the second wire generates a third current through the third wire, wherein a magnitude of the third current is based on an amount of the inductive coupling.

15. The inductive device of claim 14, wherein the magnitude of the third current is zero amperes when the magnitude of the first current and the magnitude of the second current are equal.

16. The inductive device of claim 14, wherein cross-sectional dimensions of the third wire are selected to impart a particular amount of inductive coupling between the first wire and the second wire.

17. The inductive device of claim 14, wherein the two similar inductive structures are created using a semiconductor fabrication process.

18. An inductive device, comprising: a first wire; a second wire, parallel to the first wire; a third wire, inductively coupled to the first wire and the second wire; a non-conductive material covering the first wire, second wire, and third wire; and a shell, including an upper portion and a lower portion, surrounding a portion of the nonconductive material, wherein the shell includes at least one magnetized layer; wherein the shell, and the first, second, and third wires are created by joining two similar inductive structures together, each of the two similar inductive structures including a respective portion of the first, second, and third wires; wherein a difference between a magnitude of a first current through the first wire and a magnitude of a second current through the second wire generates a third current through the third wire, wherein a magnitude of the third current is based on an amount of the inductive coupling; and
wherein the inductive device includes a channel that reduces an amount of inductive coupling between the first wire and the second wire.

19. The inductive device of claim 18, wherein a cross-sectional area of the third wire is less than a cross-sectional area of the first wire, and less than a cross-sectional area of the second wire.

20. A system , comprising: an inductor, including a first wire, a second wire, and a third wire, wherein the third wire is between, and inductively coupled to, the first wire and the second wire; a voltage regulating circuit, coupled to a first end of the first wire and a first end of the second wire, and configured to generate a first current through the first wire corresponding to a first power signal, and a second current through the second wire corresponding to a second power signal, different from the first power signal; a load coupled to a second end of the first wire and a second end of the second wire; and a current detecting circuit, coupled to ends of the third wire, and configured to generate an output signal based on a magnitude of a third current through the third wire, wherein the third current is generated by the inductive coupling to the first and second wires and is based on a difference between a magnitude of the first current and a magnitude of the second current; wherein the voltage regulating circuit is further configured to selectively adjust the magnitude of the first and second currents in response to determining that the third current satisfies a particular threshold; and
wherein the voltage regulating circuit is further configured to calibrate the current detecting circuit by generating a particular magnitude of the first current through the first wire, while generating zero current through the second wire.

* * * * *